United States Patent

Sakurada

[11] Patent Number: 5,948,160
[45] Date of Patent: Sep. 7, 1999

[54] METHOD FOR DETECTING TORSIONAL OSCILLATIONS AND METHOD FOR MANUFACTURING A SINGLE CRYSTAL

[75] Inventor: Shinichi Sakurada, Amagasaki, Japan

[73] Assignee: Sumitomo Sitix Corporation, Hyogo, Japan

[21] Appl. No.: 08/917,937

[22] Filed: Aug. 27, 1997

[51] Int. Cl.$^6$ .................................................. C30B 15/26
[52] U.S. Cl. .............................. 117/14; 117/15; 117/201; 117/202
[58] Field of Search .................................... 117/200, 201, 117/202, 217, 218, 222, 911, 14, 15

[56] References Cited

U.S. PATENT DOCUMENTS

| | | | |
|---|---|---|---|
| 4,969,745 | 11/1990 | Ibe | 356/375 |
| 5,156,822 | 10/1992 | Whipple, III | 117/201 |
| 5,170,061 | 12/1992 | Baba | 117/201 |
| 5,665,159 | 9/1997 | Fuerhott | 117/201 |

FOREIGN PATENT DOCUMENTS

| | | |
|---|---|---|
| 63-170296 | 7/1988 | Japan . |
| 5-221785 | 8/1993 | Japan . |

OTHER PUBLICATIONS

"A system for collection and on line integration of x-ray diffraction data from a multiwire area detector", Bluu., et al; Journal of Applied Crystallograph; vol. 20 pp. 235–241 (Jun. 1, 1987).

"One year experience with a high resolution ring detector position camera system: present status and future plans", 1980.

*Primary Examiner*—Felisa Hitashew
*Attorney, Agent, or Firm*—Armstrong, Westerman, Hattori, McLeland & Naughton

[57] ABSTRACT

The invention relates to a method for detecting torsional oscillations among abnormal oscillations occurring during the course of pulling of a single crystal, and also to a method for manufacturing a silicon single crystal using this method. Torsional oscillations are detected by detecting seam portions of a silicon single crystal being rotated with a camera device, memorizing time intervals of the signals outputted by detection of the seam portions, calculating an average value of the time intervals, comparing a time interval of freshly outputted signals with the average value, and deciding occurrence of torsional oscillations in the single crystal when the resulting deviation exceeds a predetermined value. When this method is adopted for pulling of a silicon single crystal, the single crystal is prevented from generating a dislocation and from dropping owing to the breakage at a neck portion thereof. Thus, the silicon single crystal can be manufactured with an improved yield and with a high efficiency.

11 Claims, 3 Drawing Sheets

FIG.3(a)     FIG.3(b)
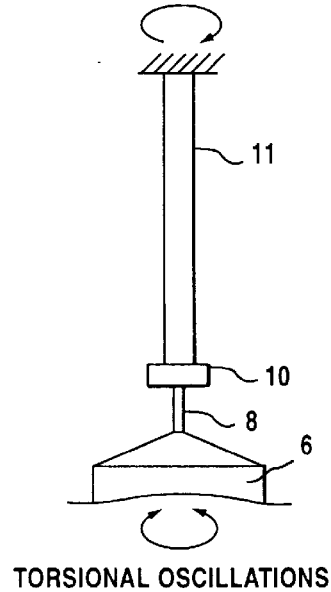
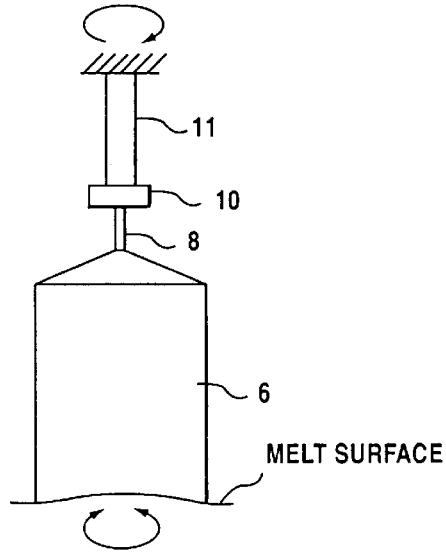
FIG.4(a)
FIG.4(b)
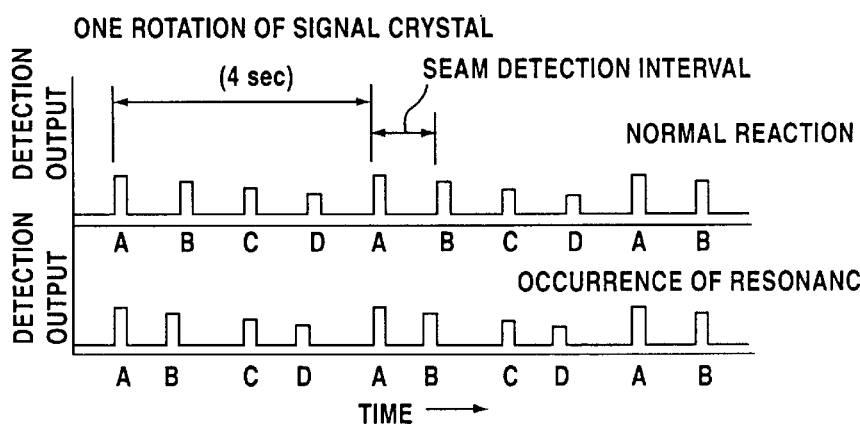

METHOD FOR DETECTING TORSIONAL OSCILLATIONS AND METHOD FOR MANUFACTURING A SINGLE CRYSTAL

FIELD OF THE INVENTION

This invention relates to apparatus and method for detecting torsional oscillations among abnormal oscillations generated in a single crystal in the course of pulling of a silicon single crystal and also to a method for manufacturing a silicon single crystal using the apparatus and method. More particularly, the invention relates to a pulling method wherein a silicon single crystal being pulled is prevented from polycrystallization and also from dropping owing to the breakage at the neck portion thereof.

DESCRIPTION OF THE RELATED ART

For the manufacture of a silicon single crystal, there is frequently used a method wherein a silicon material of high purity is molten under reduced pressure in an atmosphere of argon, and the molten silicon is solidified while pilling upwardly by use of a seed crystal.

FIG. 1 is a longitudinal section showing an apparatus of manufacturing a silicon single crystal by solidifying a silicon melt while pulling. A chamber 2 is provided to hermetically close a pulling atmosphere of a silicon single crystal 6 with the atmosphere being controlled under reduced pressure. A melting crucible 13 having a double structure is placed within the chamber 2, and a heater 14 constituted of an induction heating coil is provided to surround the melting crucible therewith. A lagging wall 15 made of a heat insulating material in the form of a hollow cylinder is disposed around the heater 14. A starting material for crystal growth molten by means of a heater, i.e. a melt 16 of a starting silicon material, is accommodated in the melting crucible. A seed crystal 9 attached to the tip of a pull shaft 11 by means of a seed crystal holder 10 is contacted to the surface of the melt. The seed crystal is upwardly pulled, so that a silicon single crystal 6 grows at the lower end of the seed crystal as a result of solidification of the melt. At this time, the melting crucible is rotated about a rotary shaft 17 and the silicon single crystal is rotated by a rotation driver means 12 so that the directions of the rotation are opposite to each other.

The single crystal is prepared by initially growing a neck portion 8 with a diameter of 2 to 10 mm and a length of 50 to 300 mm at the tip of the seed crystal to form a dislocation-free single crystal, after which the neck is expanded to a given diameter by appropriately controlling the temperature of the melt, the lift rate, and the crystal rotation rate until it grows to a given length with the given diameter. In order to cause the silicon single crystal to grow to a given diameter and to a given length, it is necessary to appropriately control the temperature of the melt, the pulling rate, the rotation rate of the crystal and the rotation rate of the crucible.

Irrespective of the control of these parameters, when the rotary center of the single crystal being pulled is eccentric, the dislocation-free growth of the single crystal is stopped on its way, thereby causing a polycrystallization phenomenon, i.e. a rise to dislocation. Thus, the pulling has to be interrupted.

The chamber is reduced to about 10 Torr., and an argon gas is fed from a gas feed port 18. SiO gas generated from the surface of the silicon melt and CO gas generated from the carbon crucible and the heater are discharged from a gas discharge port 19 along with the argon gas. When the condensed impurities such as of the SiO gas and the CO gas are taken in the growth interface 7 of the single crystal, rise to dislocation takes place.

In recent years, there is a great demand for the manufacture of a silicon single crystal of a large diameter, with the tendency that the diameter of a silicon single crystal to be pulled becomes large. If the single crystal is made in a large diameter of 8 inches or 12 inches, the rise to dislocation is more likely to occur, thereby causing the yield of the single crystal to lower and the single crystal to be dropped owing the breakage at a neck portion.

It is usual to monitor, during the course of pulling of the silicon single crystal, the growth interface 7 between the silicon melt and the crystal by means of a camera device 1 (i.e. a CCD camera device in the figure) from a sight glass provided at a side wall of the chamber. When the rise to dislocation takes place, the pulling is stopped. If the pulling is stopped, there arise the problems on how to treat the residue of the melt 16 left in the melting crucible and also on the lowering in yield of the single crystal. Thus, it is important how to overcome the problems, particularly, in the pulling or lifting of the single crystal of a large size.

In order to prevent the rise to dislocation, it is essential that any foreign matter be not taken in at the interface of growth of the single crystal. To this end, many attempts have been proposed and, in fact, put into practice. In one such attempt, there is known a method wherein it is designed not to fluctuate the rotary axis of a crystal at the growth interface of the crystal, i.e. not to make eccentric rotation at the center thereof. For this purpose, as shown in FIG. 1, there is used a device wherein a rigid pull shaft 11 for lifting a single crystal is employed in place of a wire pull shaft which is very liable to fluctuate. However, where this type of device is used, there is the possibility that rise to dislocation takes place or the single crystal incidentally drops owing to the breakage at its neck portion.

The reason why rise to dislocation occurs, or the dropping trouble is caused by the breakage at the neck portion during the course of pulling of a silicon single crystal although using the device provided with such a rigid pull shaft is considered to reside in the torsional oscillations at the neck portion cause by resonance. Japanese Laid-open Patent Application No. 5-221785 discloses a device for suppressing the torsional oscillations. In this disclosure, a buffer device or a device for avoiding breakage is provided between the pull shaft and a seed crystal or a seed crystal holder so that the oscillations of a crystal being pulled and, particularly, torsional oscillations, are mitigated. The buffer device is slipped when a torsional load greater than a certain value is exerted thereon. Using the device, torsional oscillations caused at one resonant point can be avoided. However, plural resonant points are usually created in a single crystal being pulled. The buffer device of the type discussed above which works effectively only when oscillations in coincidence with the buffer device are produced does not serve as an effective suppressing means.

SUMMARY OF THE INVENTION

An object of the invention is to provide apparatus and method for detecting torsional oscillations among abnormal oscillations generated during the course of pulling a single crystal by means of a pull shaft, and also to a method for manufacturing a silicon single crystal which can prevent the polycrystallization of the single crystal and the dropping trouble of the crystal owing to the breakage at the neck portion thereof.

In order to achieve the above object, we made extensive studies on the causes for rise to dislocation of a silicon single crystal and also for the drop resulting from the breakage at a neck portion. As a result, it has been found that a pull shaft, and a neck portion and a right shell or cylinder portion of a single crystal act as a kind of spring, with which torsional oscillations are produced to change a circumferential speed thereby causing rise to dislocation of the single crystal and the breakage of the neck portion. The invention has been accomplished based on this finding. The invention is thus concerned with (1) a torsional oscillation detecting apparatus particularly shown in FIG. 2, (2) a torsional oscillation detecting method, and (3) a method for manufacturing a silicon single crystal as defined below.

(1) An apparatus for detecting torsional oscillations of a silicon single crystal which comprises a camera device disposed at an outside of a silicon single crystal growth chamber to detect rotation of a single crystal 6 within the chamber, a memory 22 for processing and memorizing a signal from the camera device, a processing unit for comparing the signal from the camera device with the signal from the memory to decide whether or not a single crystal 6 is torsionally oscillated.

(2) A method for detecting torsional oscillations of a silicon single crystal which comprises detecting seam portions 61 of a silicon single crystal 6 being rotated with a camera device, memorizing time intervals of signals outputted by detection of the seam portions, calculating an average value of the intervals, comparing a time interval of freshly outputted signals with the average value, and deciding occurrence of torsional oscillations in the single crystal when the deviation obtained by the comparison exceeds a predetermined value.

(3) A method for manufacturing a silicon single crystal which comprises melting a silicon staring material in an inert atmosphere under reduced pressure, lifting the resultant melt 16 upwardly with the aid of a seed crystal fixed at a tip of a rigid pull shaft 11 while rotating about the axis of the shaft, and solidifying the melt 16, characterized by comprising detecting seam portions 61 of a silicon single crystal 6 being rotated by means of a camera device, memorizing time intervals of signals outputted by detection of the seam portions in a memory 22, calculating an average value of the intervals, comparing a time interval of freshly outputted signals with the average value, inputting the decided signal to a silicon rotation driver 12, and changing a rotation rate.

The positions at which the seam portions are detected should preferably correspond to edge portions 64 formed at an outer periphery of the silicon single crystal.

BRIEF DESCRIPTION OF THE DRAWINGS

FIGS. 2(a) and 2(b) are, respectively, a view illustrating a method for controlling the rotation rate of a single crystal by detection of seam portions of the single crystal wherein FIG. 2(a) is a side view showing a state of detecting the seam portions and a block diagram showing the control of a rotation rate of the single crystal, and FIG. 2(b) is a plan view showing a state of detecting the seam portions as viewed from above;

FIGS. 3(a) and 3(b) are, respectively, a view showing the mode of oscillation of a single crystal at a neck portion serving as a spring and particularly, a view showing torsional oscillations in case where the neck portion acts as a helical spring; and FIGS. 4(a) and 4(b) are, respectively, a view showing outputs from seam portions when detected with a CCD camera in relation to the variation in time wherein FIG. 4(a) is a view showing a seam detection output when rotation is normal and FIG. 4(b) is a view showing a seam detection output when torsional oscillation occurs owing to resonance.

DESCRIPTION OF THE PREFERRED EMBODIMENTS

The invention relates to a method which comprises detecting a change in circumferential speed of a right shell of a single crystal owing to the increase in amplitude of torsional oscillations with a CCD camera, processing the detected signal to decide the occurrence of resonance in the crystal, inputting an output of the decided signal to a rotation driver, and changing the rotation rate of the single crystal to dislocate a resonant point thereby suppressing torsional oscillations. The rotation rate of the single crystal being pulled is in the range of 1 to 30 rpm. For the dislocation of a resonant point, it is sufficient to change (increase or decrease) the rotation rate by 1 rpm for several minutes.

Figure 2A:
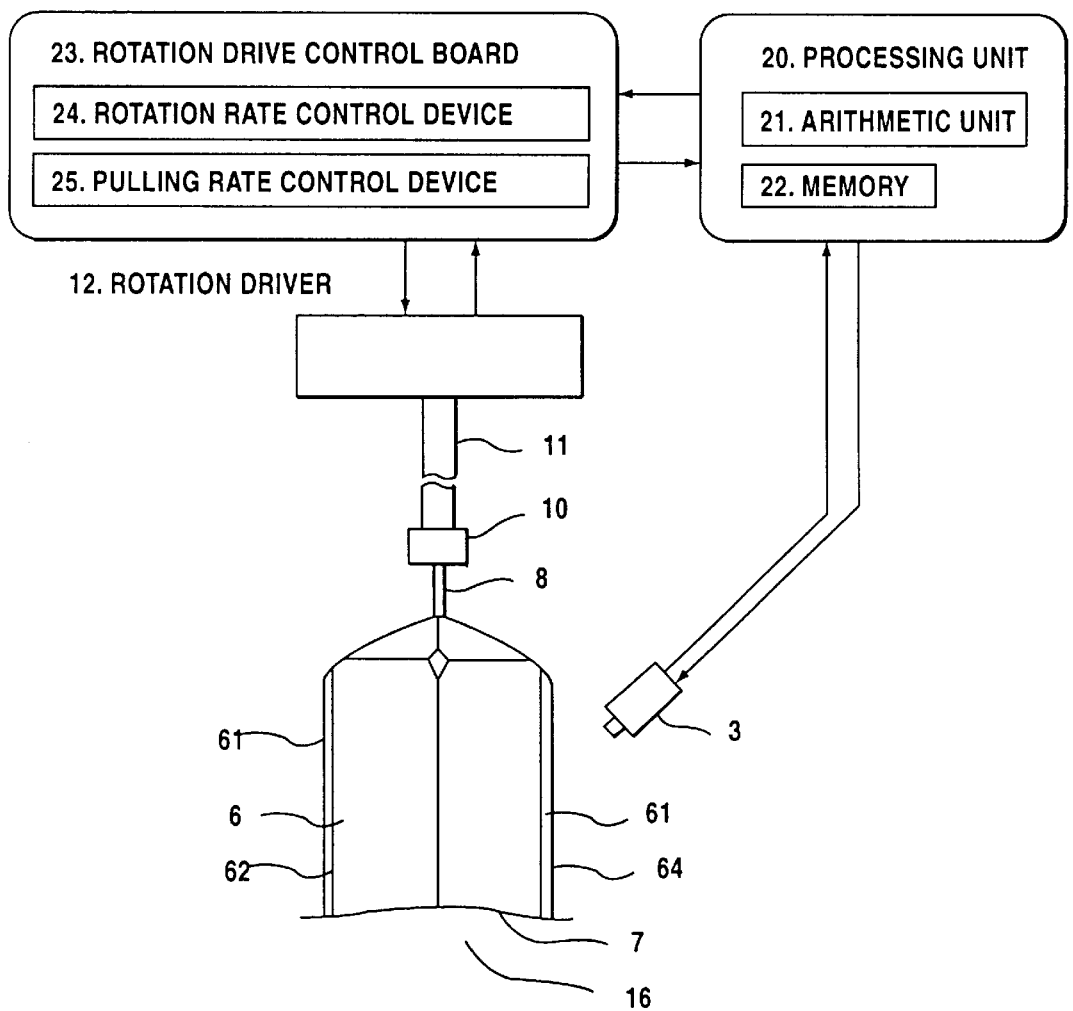
Figure 2B:
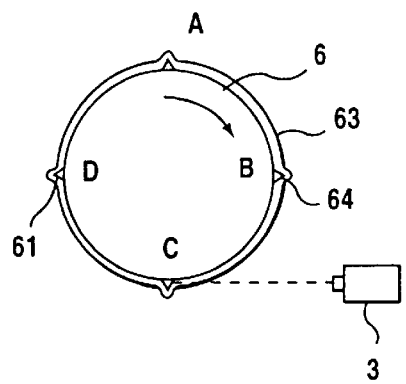

FIGS. 2(a) and 2(b) are, respectively, a view illustrating a method for controlling the rotation rate of a single crystal by detection of seam portions of the single crystal wherein FIG. 2(a) is a side view showing a state of detecting the seam portions and also a block diagram of controlling the rotation rate of the single crystal, and FIG. 2(b) is a plan view showing a state of detecting the seam portions as viewed from above. The mechanism of controlling the rotation rate of the single crystal shown in the figures includes a CCD camera 3, a processing unit 20 consisting of an arithmetic unit and a memory 22, and a rotation drive control board consisting of a pull shaft rotation rate control unit 24 and a pull rate control unit 25.

Figure 1:
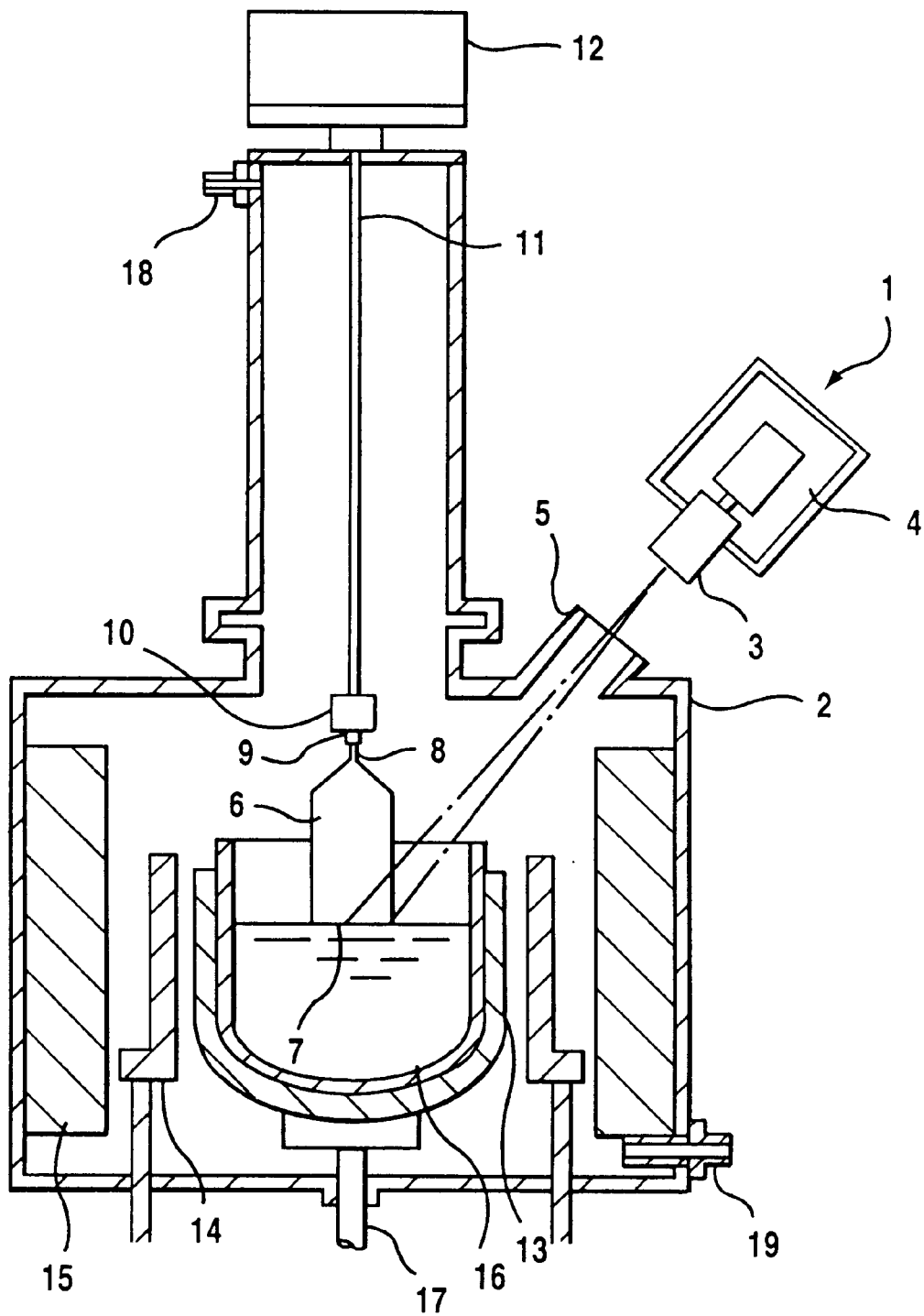
FIG. 1 is a longitudinal sectional view showing an apparatus for manufacturing a silicon single crystal solidified while pulling.

The CCD camera device is a known one and is disposed outside a chamber 2 as is particularly shown in FIG. 1. The device is constituted of the CCD camera 3 and an X-Y table 4. The CCD camera 3 scans a right shell 62 of a single crystal 6 or seam portions 61 at a growth interface 7 via a sight glass 5 provided at the shoulder of the chamber.

(1) The oscillation produced by resonance is described.

FIG. 3(a) and FIG. 3(b) are, respectively, a view showing the mode of oscillations of a single crystal when the neck portion serves as a spring. More particularly, FIGS. 3(a) and (b) are, respectively, a view showing torsional oscillations in case where the neck portion acts as a helical spring.

The single crystal 6 is lifted while rotating about the axis or center of a pull shaft 11 via a neck portion 8 having a diameter of 2 to 10 mm, a seed crystal and a holder 10. At the time, the pull shaft, the neck portion and the right shell of the single crystal are oscillated while the neck portion acts as a spring. More particularly, the single crystal is rotably driven about the center of the pull shaft, so that the single crystal is exerted with a rotary drive force in one direction through the neck portion. However, when the characteristic frequency of the oscillation system including the neck portion and the single crystal portion and the rotation rate of the pull shaft are in coincidence with each other, resonance phenomena take place and the single crystal is torsionally oscillated.

Accordingly, when the single crystal undergoes oscillations wherein the neck portion serves as a spring as shown in FIGS. 3(a) and 3(b), the circumferential speed of the right shell of the single crystal being rotated changes. This causes disturbance at the interface of the melt, thereby making a rise to dislocation. FIG. 3(a) shows the state established immediately after the formation of the neck portion. As shown in FIG. 3(b), when the growth of the crystal proceeds and the length of the shell of the single crystal is so large that a weight added to the neck portion increases, not only the crystal is dislocated, but also the crystal drops owing to the breakage at the neck portion.

The resonance phenomena may occur three times in a maximum during the course of the pull of the single crystal. More particularly, the phenomena may take place two times prior to or after the growth to a given diameter from the neck portion and once when the length of the shell reaches substantially a predetermined length. With the resonance produced prior to or after the growth to a given length from the neck portion, the rise to dislocation is liable to occur. On the other hand, with the resonance occurring when the crystal grows almost to a predetermined length of the shell, it is apt to cause the rise to dislocation of the crystal and the drop by breakage of the crystal.

(2) A detection method at the time when the resonance occurs is described.

In FIGS. 2(a) and 2(b), the seam 61 is a habit line formed in the single crystal and develops in the form of a fin from the shoulder of the single crystal to the right shell portion, and four to six lines are formed substantially at equal intervals.

The detection of the seam portions may be performed, as shown by the arrow of broken line in FIG. 2(b), by a method wherein the focus of the CCD camera 3 is directly placed on the seam portion 61 generated on the right shell portion 62 or by a method wherein a meniscus ring portion 63, which is formed at the boundary between the single crystal 6 and the melt 16 and is relatively bright, is focused. In either method, plural peak outputs are detected by the CCD camera, so that a stroboscopic system is adopted, for example, to specifically identify one output among them.

Where a CCD camera is used for the detection, the outer peripheral portion of the cylindrical silicon single crystal imaged with the CCD camera is called an edge portion 64 (e.g. the edge portion 64 is formed at opposite positions of the outer peripheral portion in FIG. 2(b)). Where the seam portion is detected with the CCD camera, it is preferred to detect when the seam portion is positioned at either of the edge portions 64. This is because the detection of the seam portion becomes easy along with the ease in focusing. The CCD camera may be either a one-dimensional CCD camera or a two-dimensional CCD camera.

FIGS. 4(a) and 4(b) are, respectively, a view showing the outputs obtained by detection of the seam portions with a CCD camera in relation to time wherein FIG. 4(a) is a view showing seam detection outputs when rotation is normal and FIG. 4(b) is a view showing seam detection outputs when torsional oscillation occurs owing to the resonance.

As shown by the arrow of broken line in FIGS. 2(a) and 2(b), when the seam portion 61 is detected with the CCD camera 3, a difference in luminance occurs owing to the variation in reflected light which is caused by the swing of the crystal and the fluctuation of the melt surface, so that output signals differ from each other as is shown in FIGS. 4(a) and 4(b). When the single crystal is rotated normally, the time intervals of the seam detection outputs (A, B, C, D) from the CCD camera appear substantially at equal intervals as shown in FIG. 4(a). However, when the single crystal is torsionally oscillated by the action of the resonance, the intervals of the seam detection outputs of the CCD camera become shorter at A-B and C-D as shown in FIG. 4(b) and longer at B-C and D-A, thus being irregular. In this way, the resonance is decided as occurring at the time when the tine intervals of the seam detection outputs become irregular.

(3) A method of avoiding the resonance after decision of the occurrence of the resonance in the single crystal is described.

In FIGS. 2(a) and 2(b), the focus of the CCD camera is placed on the right shell of the single crystal grown to a predetermined diameter as is shown by the arrow of broken line to detect the seam portions, and the detected output time intervals are memorized in the memory 22 of the processing unit 20. The diagram shown, for example, in FIG. 4(a) shows the case where the single crystal has four seams. In the case, the time intervals of the respective outputs appear substantially at equal intervals, from which it is decided in the processing unit that the single crystal is normally rotated It should be noted that in FIGS. 4(a) and 4(b), in order to distinguish the outputs at the respective seams, the magnitudes of the output values are purposely varied and expressed as symbols A to D, respectively.

The time intervals of the seam detection outputs to be subsequently inputted are inputted to the arithmetic unit wherein they are compared with the intervals memorized in the memory. Where the time interval of the detected output is so small as in the case of A-B shown in FIG. 4(b), or where the interval is so larger as in the case of B-C, it is decided that the torsional oscillation occurs in the single crystal and the resonance takes place.

When it is decided in the processing unit that the resonance occurs in the single crystal, a signal is transmitted to the rotation rate control device 24 of the rotation drive control board 23, and a control signal is outputted from the rotation rate control device to the rotation driver 12 to change the rotation rate of the single crystal by 1 or 2 rpm from a current rotation rate (i.e. the rotation rate may be increased or decreased) to avoid the resonance. When this state is maintained over about 5 minutes, the growth of the single crystal proceeds, under which it is frequently experienced that the resonance does not occur at the original rotation rate. Accordingly, it is preferred to return the rotation rate to the original one.

(4) Another method of deciding the occurrence of resonance is described.

(A) The time intervals of the seam detection outputs based on the rotation of the crystal are, respectively, memorized in the processing unit 20 and the memory 22. The seam detection output time intervals subsequently inputted are compared with the memorized interval (i.e. an average value described hereinafter). When the resulting difference is within ±10%, it is decided that the crystal normally rotates. The data decided as the rotation being normal is added to the memorized data, from which an average value is obtained.

(B) A subsequently inputted seam detection output time interval is compared with the memorized average time interval. When the difference exceeds a range of ±10%, it is decided that the crystal is torsionally oscillated and the resonance occurs. To avoid the resonance, the procedure of (3) set out before is adopted.

A specific detection method and an avoiding method in the course of the manufacturing steps of a silicon single crystal are described.

Using the torsion signal detecting apparatus shown in FIG. 2(a), i.e. the silicon single crystal manufacturing apparatus including the processing unit 20 and the rotation drive control board 23, and 100 kg of polysilicon was melted to prepare a single crystal with a diameter of 220 mm and a length of 1000 mm. A pull shaft of the single crystal manufacturing apparatus had a diameter of 70 mm. The grown single crystal had a neck portion which had an intended diameter of 6 mm, an intended length of 200 mm, and an intended diameter enlarged at a shoulder portion of 260 mm, under which a desired shape was formed by control of a computer. Thereafter, a torsional oscillation detector for the crystal using a CCD camera was operated at a rotation rate of 15 rpm at a pull rate of 0.8 mm/minute, thereby starting a pull test of a right shell portion of the single crystal.

1 hour and 3 hours after the operation of CCD camera, the CCD camera detected two occurrences of torsional oscillations, at which the rotation rate of the pull shaft was automatically changed to 16 rpm. At the time when the length of the right shell reached 800 mm, a third occurrence of torsional oscillations was detected and the rotation rate of the pull shaft was changed to 16 rpm.

For comparison, a pull test was repeated without operation of any CCD camera, whereupon it was confirmed by means of a monitoring television as viewed from a sight glass that polycrystallization took place 2 hours after formation of the shoulder portion, thus the pulling being stopped.

In this way, it has been found that when using the oscillation detector of the invention, the torsional oscillations based on the resonance of a single crystal are detected and the rotation rate of the single crystal is appropriately changed, thereby preventing rise to dislocation or the dropping trouble caused by breakage at the neck portion.

As will be apparent from the foregoing, when a torsional oscillation detecting method using a torsional oscillation detecting apparatus of a single crystal including a CCD camera is applied to the manufacture of a silicon single crystal, rise to dislocation of the crystal caused by the occurrence of dislocation and the drop of the single crystal by breakage at the neck portion can be appropriately prevented.

What is claimed is:

1. A method for detecting torsional oscillations of a silicon single crystal which comprises:

a) detecting seam portions of a silicon single crystal being rotated with a camera device;

b) memorizing a time interval of signals outputted by detection of the seam portions;

c) comparing a time interval of subsequently detected, freshly outputted signals with the first-mentioned time interval to decide whether or not abnormal oscillations occur in said single crystal.

2. A method according to claim 1, wherein said camera consists of a one-dimensional CCD camera or a two-dimensional CCD camera and an X-Y table.

3. A method according to claim 1, wherein said camera device detects a seam portion at a position which corresponds to an edge portion formed at an outer peripheral portion of a right shell of said silicon single crystal.

4. A method according to claim 1, wherein for the decision of the occurrence of abnormal oscillations, an average value of time intervals of signals outputted by detection of seam portions is compared with a time interval of freshly outputted signals to determine a deviation of said freshly outputted signals from the average value to decide whether or not abnormal oscillations occur.

5. A method according to claim 4, wherein when said deviation exceeds a range of ±10% of the average value of the time intervals of the signals outputted by detection of the seam portions, it is decided that abnormal oscillations occur.

6. A method for manufacturing a silicon single crystal which comprises:

a) detecting seam portions of a silicon single crystal being rotated by means of a camera device;

b) memorizing a time interval of the signals outputted by detection of the seam portions in a memory;

c) comparing a time interval of freshly outputted signals with the first-mentioned time interval to decide whether of not torsional oscillations have developed; and d) inputting a decided signal to a silicon rotation driver to change a rotation rate in response to the comparison in step (c), wherein a silicon material is melted in an inert atmosphere under reduced pressure, lifted upwardly with the aid of a seed crystal fixed at a tip of a rigid pull shaft while rotating about the axis of the shaft, and solidified.

7. A method according to claim 6, wherein said camera device consists of a one-dimensional CCD camera or a two-dimensional CCD camera, and an X-Y table.

8. A method according to claim 6, wherein said camera device detects a seam portion at a position which corresponds to an edge portion formed at an outer peripheral portion of a right shell of said silicon single crystal.

9. A method claim according to claim 6, wherein for the decision of the occurrence of abnormal oscillations, an average value of time intervals of signals outputted by detection of the seam portions is calculated and is compared with a time interval of freshly outputted signals to determine a deviation of said freshly outputted signals from the average value.

10. A method according to claim 9, wherein when said deviation exceeds a range of ±10% of the average value of the time intervals of the signals outputted by detection of the seam portions, it is decided that abnormal oscillations occurs.

11. A method according to claim 6, wherein when abnormal oscillations occur in the single crystal, the rotation rate of the single crystal is changed within a range of 1 rpm to 2 rpm by means of the silicon rotation driver.

* * * * *